United States Patent [19]

Nobe et al.

[11] Patent Number: 5,296,723
[45] Date of Patent: Mar. 22, 1994

[54] LOW OUTPUT CAPACITANCE, DOUBLE-DIFFUSED FIELD EFFECT TRANSISTOR

[75] Inventors: Takeshi Nobe, Hirakata; Sigeo Akiyama, Neyagawa, both of Japan

[73] Assignee: Matsushita Electric Works, Ltd., Kadoma, Japan

[21] Appl. No.: 909,846

[22] Filed: Jul. 7, 1992

[30] Foreign Application Priority Data

Jul. 12, 1991 [JP] Japan .................................. 3-172600
Jul. 12, 1991 [JP] Japan .................................. 3-172601

[51] Int. Cl.$^5$ ............................................. H01L 31/12
[52] U.S. Cl. ........................................ 257/82; 257/290; 257/328; 257/408; 257/409
[58] Field of Search .............. 257/408, 328, 290, 409, 257/80, 84, 82; 307/411

[56] References Cited

U.S. PATENT DOCUMENTS

| | | | |
|---|---|---|---|
| 3,461,360 | 8/1969 | Barson et al. | 317/235 |
| 3,484,865 | 12/1969 | Nienhuis | 317/235 |
| 3,798,514 | 3/1974 | Hayashi et al. | 257/328 |
| 4,009,483 | 2/1977 | Clark | 357/52 |
| 4,072,975 | 2/1978 | Ishitani | 257/328 X |
| 4,455,565 | 6/1984 | Goodman et al. | 357/23.4 |
| 4,466,175 | 8/1984 | Coe | 29/571 |
| 4,705,759 | 11/1987 | Lidow et al. | 257/409 X |
| 4,902,626 | 2/1990 | Akiyama et al. | 437/45 |
| 5,023,678 | 6/1991 | Kinzer | 257/409 X |
| 5,179,034 | 1/1993 | Mori et al. | 257/328 X |

Primary Examiner—William Mintel
Attorney, Agent, or Firm—Kenyon & Kenyon

[57] ABSTRACT

A low output capacitance, double-diffused field effect transistor effectively realizes the reduction in the output capacitance, by providing a drain electrode on one surface of a first conduction type semiconductor substrate, forming on the other surface of the substrate, through a double diffusion, second conduction type well regions and first conduction type source regions for connection therewith of a source electrode, forming channel regions in surface zone of the well regions disposed between first conduction type zone of the semiconductor substrate and the source regions, above which channel regions being provided gate electrodes through an insulating film, forming a guard ring region surrounding the well regions, and connecting at least one capacitance component means to the gate electrodes.

10 Claims, 3 Drawing Sheets

LOW OUTPUT CAPACITANCE, DOUBLE-DIFFUSED FIELD EFFECT TRANSISTOR

BACKGROUND OF THE INVENTION

This invention relates generally to power semiconductor devices of low output capacitance and, more particularly, to a double-diffused metal-oxide semiconductor field effect transistor (which shall be hereinafter referred to simply as "DMOSFET").

The DMOSFET of the kind referred to can be effectively utilized in such devices demanding high breakdown voltage, high speed switching and high noise resistance as the power semiconductor device of a solid-state relay and so on.

DESCRIPTION OF RELATED ART

Generally, the DMOSFET shows a high breakdown voltage, high speed switching, and high noise resistance, and is advantageous as being high in the current density because of its structure but lower in the ON-resistance than in the case of non-DMOS type FETS. Further, the DMOSFET is a so-called unipolar device having no offset voltage, and is, therefore, advantageous in its capability of transmitting signals without any distortion, and the utilization of the DMOSFET as the power semiconductor device in the solid-state relay has been attracting public attention.

In the conventional DMOSFET being employed as the power semiconductor device in the solid-state relay, on the other hand, there has been involved a problem that the output capacitance ($C_{OSS}$) becomes high. Here, the output capacitance ($C_{OSS}$) is the sum total of a capacity between gate and drain ($C_{GD}$) and a capacitance between drain and source ($C_{DS}$), that is, $C_{OSS}=C_{GD}+C_{DS}$, and there arises a risk that, particularly when a high frequency signal is intended to be ON/OFF controlled by means of the DMOSFET, such signal is caused to leak through the output capacitance ($C_{OSS}$).

In U.S. Pat. No. 3,461,360 to F. Barson et al, for example, there has been disclosed a basic arrangement of the DMOSFET, in which a cup-shaped zone of one conductivity type is provided as surrounded by the other conductivity type zone, and this cup-shaped zone of one conductivity type is formed along an aperture made in an insulating film provided on a surface of semiconductor substrate. Further, as shown in U.S. Pat. No. 3,484,865 to R. J. Nienhuis, for example, there is provided an upright DMOSFET by forming either a drain or a source electrode on bottom surface of the substrate in addition to an electrode formed on top surface of the substrate.

In another U.S. Pat. No. 4,455,565 to A. M. Goodman et al, there has been disclosed a DMOSFET in which a shield electrode is formed on an insulating film on a drain zone on the top surface side having a source electrode of the semiconductor substrate, and a gate electrode is formed also on the insulating film but only at a position above channel regions. Substantially the same DMOSFET having the gate electrode on the insulating film only above the channel regions has been disclosed also in U.S. Pat. No. 4,466,175 to D. J. Coe. According to these DMOSFET's of Goodman et al and Coe, their arrangement is made to reduce the between-gate-and-drain capacitance ($C_{GD}$) and to eventually lower the output capacity $C_{OSS}$.

In these DMOSFET's according to Goodman et al and Coe, however, there has been involved a problem that the gate electrode requires a working, and the precision of this working with respect to the gate electrode has been determinative at all to the lowness of the between-gate-and-drain capacity ($C_{GD}$).

In a further U.S. Pat. No. 4,902,636 to S. Akiyama et al, there is disclosed a device in which the insulating film is made thicker at its part located above the drain zone on the top surface side of the semiconductor substrate so that the between-gate-and-drain capacitance ($C_{GD}$) can be lowered. With this arrangement, however, there arises a drawback that an accumulation layer can hardly be formed in the drain zone below the gate electrode upon application of a gate voltage, and the ON resistance becomes larger. In still another U.S. Pat. No. 4,009,483 to L. E. Clark, there has been disclosed a DMOSFET in which a guard ring zone is formed circumferentially about a main PN junction so as to improve relatively high breakdown voltage characteristics. In this case, a depletion layer extended from the main PN junction is further made to extend towards the guard ring, as a result of which the depletion layer can be shaped to be as much gentle as possible in the slope, and the electric field intensity in the interior of the DMOSFET can be minimized. While the provision of such a guard ring is effective to have the DMOSFET provided with a high breakdown voltage, there is involved a problem that the source electrode is caused to be electrically connected to the guard ring, and the capacitance between this guard ring and the drain is made as it is to be the between-drain-and-source capacitance ($C_{DS}$) so that the output capacitance will have to be increased.

SUMMARY OF THE INVENTION

A primary object of the present invention is, therefore, to provide a low output-capacitance, double-diffused field effect transistor (DMOSFET) which solves the foregoing problems and is capable of transmitting output signals without any distortion, lowering the output capacitance ($C_{OSS}$) without raising the ON resistance, and preventing the high frequency signals from leaking in the OFF state of the device.

According to the present invention, this object can be realized by a low output-capacitance, double-diffused field effect transistor wherein a drain electrode connected to a drain terminal is provided on one of two major surfaces of a semiconductor substrate of first conduction type, well regions of second conduction type and source regions of the first conduction type are formed by means of a double diffusion in the other major surface of the substrate, channel regions are defined in surface area of the well regions to be between first conduction type zone of the semiconductor substrate and the source regions, gate electrodes connected to a gate terminal are provided above the channel regions with an insulating film interposed between them, a source electrode connected to a source terminal is provided with respect to the source regions, and a guard ring region of the second conduction type is provided outside the well regions including the channel regions, characterized in that the gate electrodes are connected to the gate terminal through at least a capacitance component means.

Other objects and advantages of the present invention shall become clear as following description of the invention advances as detailed with reference to preferred embodiments shown in accompanying drawings.

While the present invention shall now be described with reference to the embodiments shown, it will be appreciated that the intention is not to limit the invention only to these embodiments but rather to cover all alterations, modifications and equivalent arrangements possible within the scope of the appended claims.

DETAILED DESCRIPTION OF THE PREFERRED EMBODIMENTS

Generally, in the DMOSFET to be employed as, for example, the power semiconductor device in the solid-state relay, it is desirable for lowering the output capacitance ($C_{OSS}$) that either the capacitance between the gate G and the drain D ($C_{GD}$) or the capacitance between the drain D and the source S ($C_{DS}$) is lowered. In this connection, it is possible to lower the output capacitance ($C_{OSS}$) by reducing the surface area of the DMOSFET, but this results in an increase in the ON resistance, so as to be undesirable. According to the present invention, a low output capacitance of the DMOSFET can be realized by means of at least a connection of a capacitance component means to the gate electrode connected to the gate terminal, without increasing the ON resistance.

Figure 1:
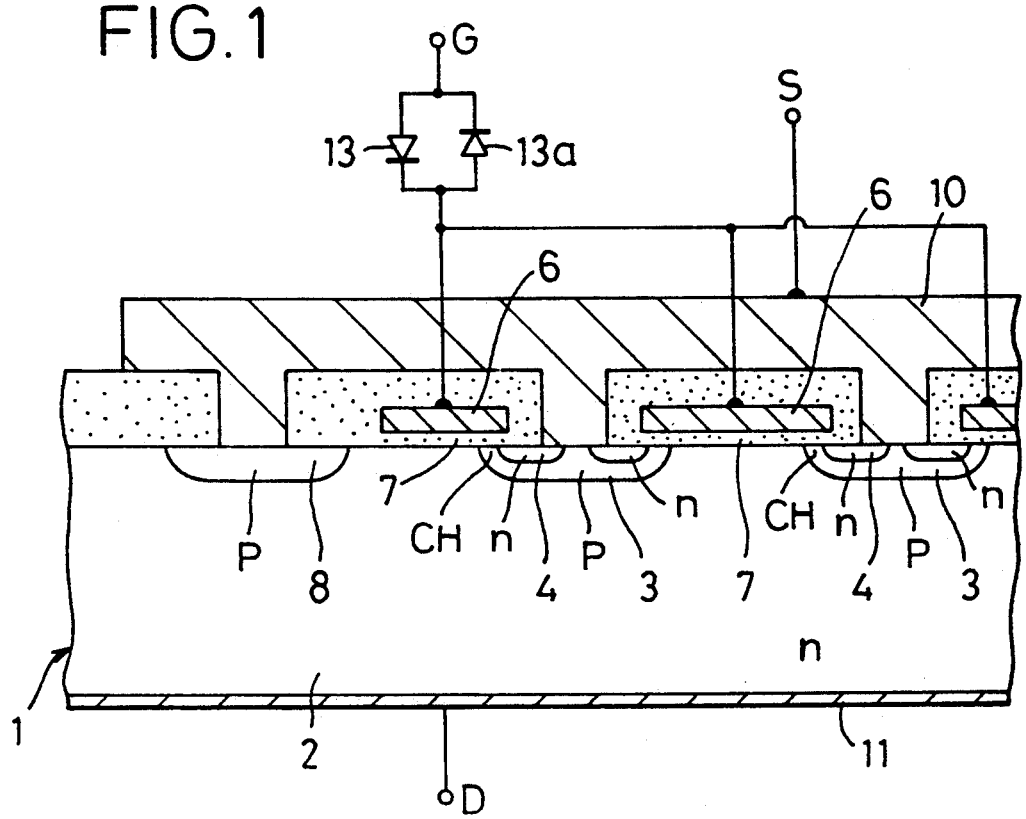
FIG. 1 shows in a sectioned view as magnified at a main part of an embodiment the DMOSFET according to the present invention.

Describing the low output capacitance DMOSFET according to the present invention with reference to the drawings, there is shown in FIG. 1 an embodiment of such DMOSFET, which comprises a semiconductor substrate 1 consisting substantially of a first conduction type, here, n-type semiconductor zone 2, and second conduction type, here, p-type semiconductor regions 3 formed in one surface of the n-type semiconductor zone 2 for forming channel regions CH, and first conduction type, here, n-type semiconductor regions 4 formed in a surface area of the p-type semiconductor regions 3 for constituting source regions.

Above the channel regions CH of the p-type semiconductor regions 3 between the n-type semiconductor zone 2 of the semiconductor substrate 1 and the n-type semiconductor regions 4 for forming the source regions, there are provided gate electrodes 6 with an insulating film 7 interposed. In this case, the p-type semiconductor regions 3 for forming the channels as well as the n-type semiconductor regions 4 for forming the source regions are formed by means of a double diffusion carried out with the gate electrodes 6 made as a mask. Further, on an outer side of the p-type semiconductor regions 3, a p-type semiconductor region 8 is formed as a guard ring for the purpose of improving the breakdown voltage characteristics. Further on the one surface of the n-type semiconductor zone 2 of the substrate 1, there is provided a source electrode 10, while on the other surface of the zone 2 a drain electrode 11 is provided. To these gate electrodes 6, source electrode 10 and drain electrode 11, there are connected a gate terminal G, source terminal S and drain terminal D, respectively.

Figure 2:
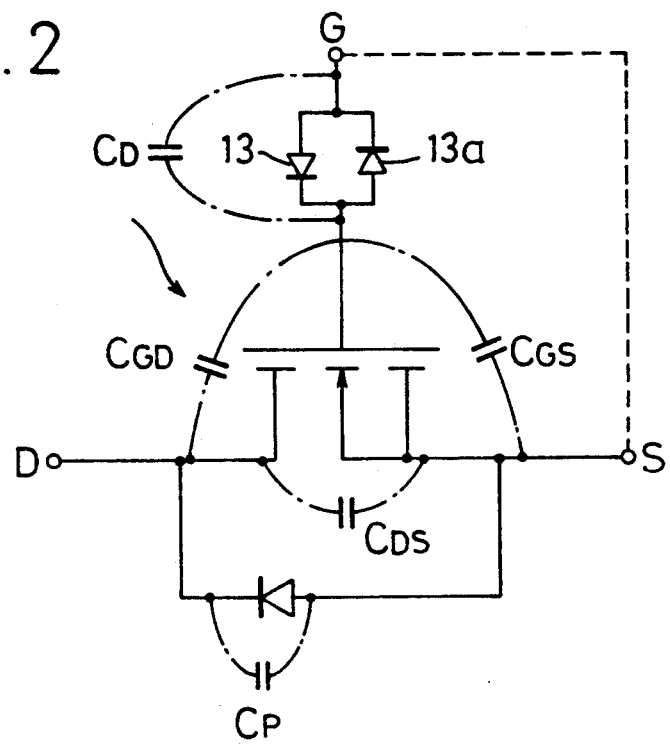
FIG. 2 is a circuit diagram equivalent to the DMOSFET of FIG. 1.

In connecting the gate electrodes 6 to the gate terminal G, there is interposed between them an inverse parallel connection of diodes 13 and 13a so that the output capacitance can be lowered. Referring more specifically to this respect with reference also to an equivalent circuit of FIG. 2, the output capacitance ($C_{OSS1}$) in this circuit is represented by a following formula:

$$C_{OSS1} = C_{DS} + C_P + \{C_{GD}(C_{GS}+C_D)\}/\{C_{GD}+C_{GS}+C_D\}$$

With the capacitance ($C_D$) of the diodes 13 and 13a made extremely small, the formula will be $$C_{OSS1} \approx C_{DS} + C_P + (C_{GD} C_{GS})/(C_{GD}+C_{GS})$$

Here, the output capacitance ($C_{OSS}$) of the conventional DMOSFET is $$C_{OSS} = C_{DS} + C_P + C_{GD}$$

and their difference will be $$C_{OSS} - C_{OSS1} = C_{GD}\{1 - C_{GS}/(C_{GD}+C_{GS})\} > 0$$

and it will be appreciated that the output capacitance is made lower than that of the conventional DMOSFET.

Figure 3:
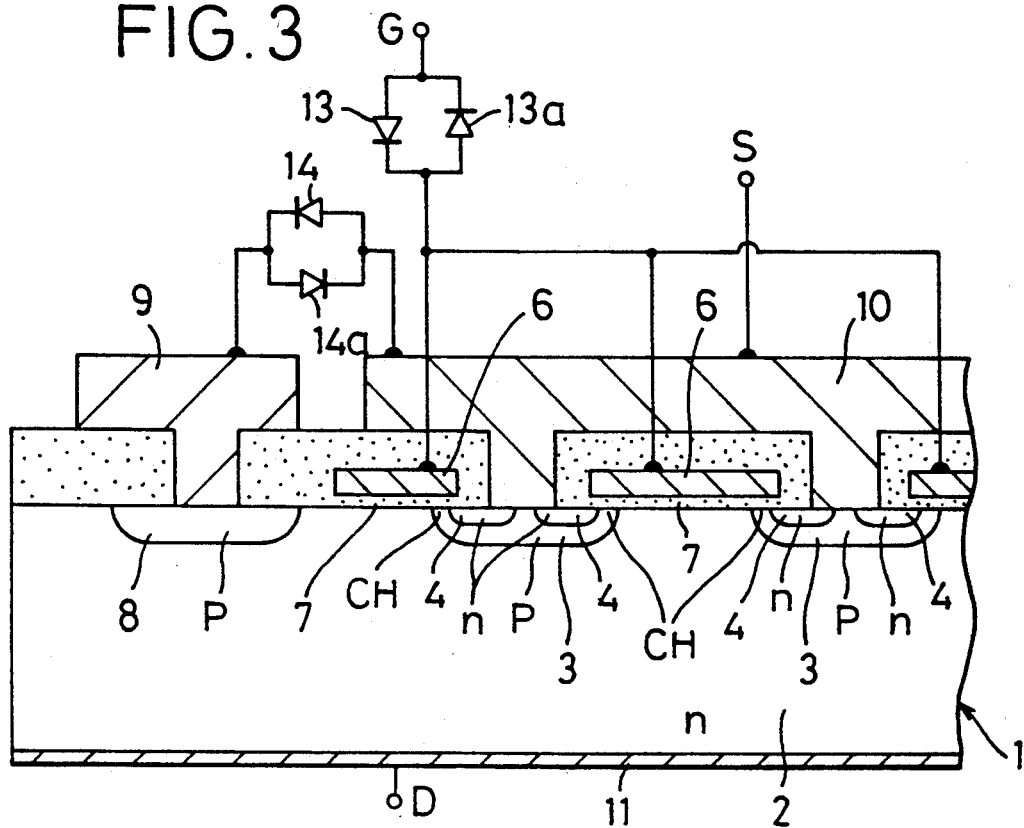
FIG. 3 shows in a sectioned view as magnified also at a main part of another embodiment the DMOSFET of the present invention.

In FIG. 3, there is shown another embodiment of the DMOSFET according to the present invention, wherein the same constituent elements as those in the embodiment of FIG. 1 are denoted by the same reference numerals as those used in FIG. 1. In the present embodiment, in contrast, a contact electrode 9 is formed on the p-type guard ring semiconductor region 8 formed outside the p-type channel-forming semiconductor regions 3 for improving the breakdown voltage characteristics, to be separate from the source electrode 10, and a further inverse parallel connection of diodes 14 and 14a is connected across these contact electrode 9 and source electrode 10.

Figure 4:
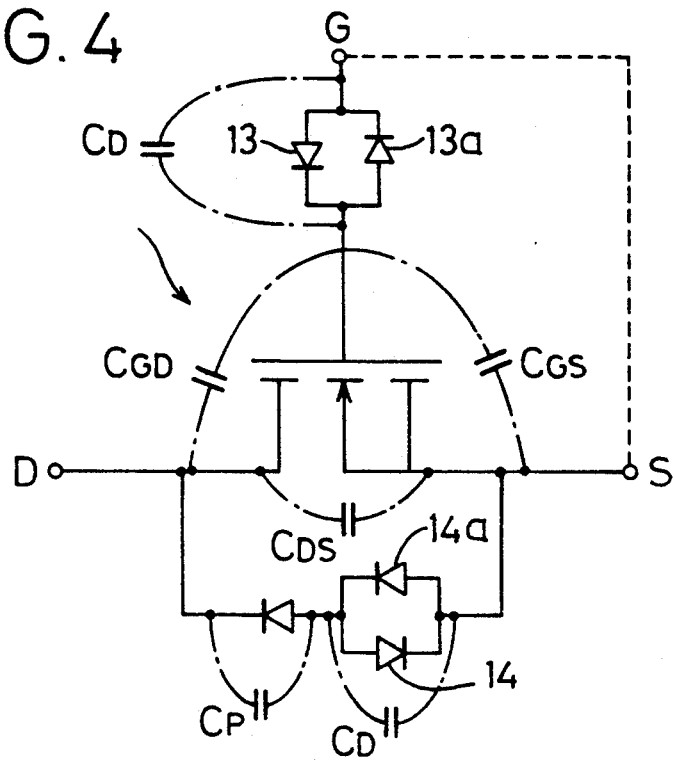
FIG. 4 is a circuit diagram equivalent to the DMOSFET of FIG. 3.

Referring more specifically to the operation for lowering the output capacitance in the present embodiment with reference also to an equivalent circuit of FIG. 4, the output capacitance ($C_{OSS2}$) in this equivalent circuit will be $$C_{OSS2} = C_{DS} + (C_D C_P)/(C_D+C_P) + [\{C_{GD}(C_{GS}+C_D)\}/(C_{GD}+C_{GS}+C_D)\}]$$

With the output capacitance of the diode connections 13,13a and 14,14a made extremely small, the formula will be $$C_{OSS2} \approx C_{DS} + (C_{GD} C_{GS})/(C_{GD}+C_{GS})$$

Comparing this with the output capacitance ($C_{OSS}$) of the conventional DMOSFET, then $$C_{OSS} - C_{OSS2} = C_P + C_{GD}[1 - \{C_{GS}/(C_{GD}+C_{GS})\}] > 0$$

and it will be appreciated that the output capacitance of this embodiment is made lower than that of the conventional DMOSFET.

Now, in the foregoing DMOSFET's of FIGS. 1 and 3, the inverse parallel connection or connections of the diodes 13 and 13a or of 13,13a and 14,14a are acting as the capacitance component, and are caused to be inserted in series in parasitic capacitance component of the DMOSFET so that the output capacitance will be thereby reduced. Here, it is effective to use the diodes of the inverse parallel connection as the capacitance component. That is, a capacitance component means interposed between the gate electrodes and their common gate terminal is required to achieve a function of providing to the gate electrodes any higher voltage applied to the gate terminal than a threshold voltage of the DMOSFET and also turning the DMOSFET to ON state. Similarly, the capacitance component means interposed between the contact electrode and the source electrode is also required to provide to the source electrode any higher voltage applied to the source terminal than a predetermined voltage, for maintaining the breakdown voltage. Taking these respects into account, a utilization of normal directional characteristics of the diode as the capacitance component means results in that the diode used in the normal direction operates as a condenser up to about 0.6 V, for example, but acts just as a conductor under higher voltages than that, and a desired operation can be realized. With the inverse parallel connection of the diodes, further, desired injection and withdrawal of charge are to be executed through either one of the diodes.

In addition, the gate electrode is formed normally with polysilicon employed. It will be readily appreciated, therefore, that the foregoing diodes can be provided to the semiconductor substrate in a simple manner with other parts than the gate electrodes of the polysilicon film utilized. In an event where the diodes are formed with the polysilicon film employed, in particular, the diodes will have an extremely small junction area, as a result of which the diode capacity ($C_D$) is made to be extremely slight, so that the polysilicon should find its utility as employed in the present invention.

Figure 5:
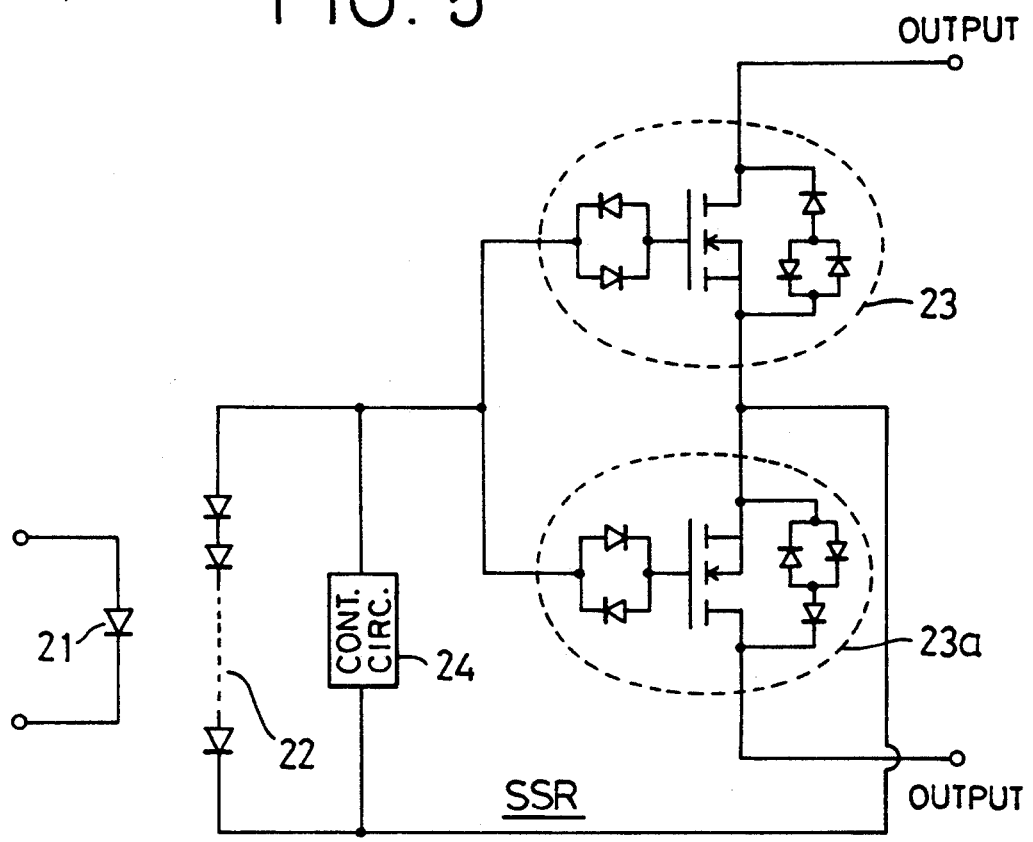
FIG. 5 is a circuit diagram showing a working aspect of a solid-state relay in which the DMOSFET of FIG. 3 is employed as a power semiconductor device.

In FIG. 5, there is shown a solid-state relay SSR in which the DMOSFET of FIG. 3 is employed as a power semiconductor device, and this solid-state relay SSR comprises a light-emitting element 21 generating an optical signal with an input signal received, an array of photovoltaic elements 22 generating a photovoltaic force upon receipt of the optical signal emitted from the element 21, power DMOSFET's 23 and 23a driven from a first impedance state to a second impedance state upon application of the photovoltaic force to the gate terminals of these power transistors, and a control circuit 24 constituting a discharge means for a gate charge of the power DMOSFET 23. In the present instance, the power DMOSFET's 23 and 23a are connected in series with their source S made common so as to be a bilateral voltage blocking arrangement. Accordingly, in the solid-state relay SSR of FIG. 5, the use of the DMOSFET according to the present invention allows the output capacitance of the relay SSR to be effectively lowered and the high frequency cut-off ability to be improved, and the relay can be effectively improved in the ability of controlling the high frequency signal.

It will be readily appreciated from the foregoings that, generally speaking, the DMOSFET according to the present invention allows the reduction of the output capacitance only to be effectively realized without causing any such inconvenience as a deterioration in the breakdown voltage characteristics, an increase in the ON resistance and so on to take place.

What is claimed is:

1. A low output-capacitance, double diffused field effect transistor comprising:

a first conduction type semiconductor substrate having two major surfaces;

a drain electrode provided on one of said major surfaces of said semiconductor substrate and connected to a drain terminal;

well regions of a second conduction type in the other of said major surfaces of said semiconductor substrate formed by means of a double diffusion to have source regions of said first conduction type in each well region, said source regions being provided thereon with a source electrode connected to a source terminal;

channel regions defined in a surface area of said well regions to be between a first conduction type semiconductor zone of said semiconductor substrate and said source regions;

gate electrodes respectively provided above each of said channel regions with an insulating film interposed between said gate electrodes and said channel regions, said gate electrodes being connected to a gate terminal through at least a capacitance component means for lowering the output capacitance of the double diffused field effect transistor; and a guard ring region of said second conduction type disposed in said first conduction type semiconductor zone to be outside said well regions including said channel regions.

2. A low output-capacitance, double diffused field effect transistor comprising:

a first conduction type semiconductor substrate having two major surfaces;

a drain electrode provided on one of said major surfaces of said semiconductor substrate and connected to a drain terminal;

well regions of a second conduction type in the other of said major surfaces of said semiconductor substrate formed by means of a double diffusion to have source regions of said first conduction type in each well region, said source regions being provided thereon with a source electrode connected to a source terminal;

channel regions defined in a surface area of said well regions to be between a first conduction type semiconductor zone of said semiconductor substrate and said source regions;

gate electrodes respectively provided above each of said channel regions with an insulating film interposed between said gate electrodes and said channel regions, said gate electrodes being connected through a first capacitance component means to a gate terminal; and a guard ring region of said second conduction type disposed in said first conduction type semiconductor zone to be outside said well regions including said channel regions, said guard ring region connected to said source electrode through a second capacitance component means.

3. A transistor according to claim 1, wherein said capacitance component means comprises a diode.

4. A low output-capacitance, double diffused field effect transistor comprising:
a first conduction type semiconductor substrate having two major surfaces;
a drain electrode provided on one of said major surfaces of said semiconductor substrate and connected to a drain terminal;
well regions of a second conduction type in the other of said major surfaces of said semiconductor substrate formed by means of a double diffusion to have source regions of said first conduction type in each well region,
said source regions being provided thereon with a source electrode connected to a source terminal;
channel regions defined in a surface area of said well regions to be between a first conduction type semiconductor zone of said semiconductor substrate and said source regions;
gate electrodes respectively provided above each of said channel regions with an insulating film interposed between said gate electrodes and said channel regions,
said gate electrodes being connected through at least a capacitance component means to a gate terminal, said capacitance component means comprising a pair of diodes connected mutually in inverse parallel relationship; and
a guard ring region of said second conduction type disposed in said first conduction type semiconductor zone to be outside said well regions including said channel regions.

5. A transistor according to claim 3, wherein said diodes are formed with polysilicon.

6. A transistor according to claim 2, wherein said capacitance component means and said another capacitance component means respectively comprise a diode.

7. A transistor according to claim 6, wherein said diode of each said capacitance component means is provided in a pair which are connected mutually in inverse parallel relationship.

8. A transistor according to claim 6, wherein said diodes are formed with polysilicon.

9. A solid-state relay comprising a light emitting means generating an optical signal upon receipt of an input signal, a photovoltaic means generating a photovoltaic force upon receipt of said optical signal emitted from said light emitting means, a power DMOSFET connected to said photovoltaic means and having a gate terminal, and means for driving said power DMOSFET from a first impedance state to a second impedance state with said photovoltaic force applied to said gate terminal;
said power DMOSFET comprising a first conduction type semiconductor substrate having two major surfaces, a drain electrode provided on one of said major surfaces of said semiconductor substrate and connected to a drain terminal, well regions of a second conduction type and source regions of said first conduction type respectively formed by means of a double diffusion in the other of said major surfaces of said semiconductor substrate, said source regions being provided thereon with a source electrode connected to a source terminal, channel regions defined in a surface area of said well regions to be between a first conduction type semiconductor zone of said semiconductor substrate and said source regions, gate electrodes respectively provided above each of said channel regions with an insulating film interposed between said gate electrodes and said channel regions, said gate electrodes being connected through a first capacitance component means to said gate terminal; and a guard ring region of said second conduction type disposed in said first conduction type semiconductor zone to be outside said well regions including said channel regions, said guard ring region being connected to said source regions through a second capacitance component means.

10. A relay according to claim 9, wherein a plurality of said power DMOSFET's are provided as connected in series to each other with said source terminal made common.

* * * * *